United States Patent [19]

Aizaki

[11] Patent Number: 5,121,007
[45] Date of Patent: Jun. 9, 1992

[54] STEP-DOWN UNIT INCORPORATED IN LARGE SCALE INTEGRATED CIRCUIT

[75] Inventor: Akane Aizaki, Tokyo, Japan

[73] Assignee: NEC Corporation, Tokyo, Japan

[21] Appl. No.: 693,122

[22] Filed: Apr. 29, 1991

[30] Foreign Application Priority Data

Apr. 27, 1990 [JP] Japan .................. 2-112410

[51] Int. Cl.$^5$ .............. H03K 5/02; H03K 17/08; H03K 19/92; H03K 17/284
[52] U.S. Cl. .................. 307/475; 307/264; 307/296.5; 307/452; 307/448; 307/296.3; 365/226; 365/189.11
[58] Field of Search ............ 307/475, 451, 264, 270, 307/482, 578, 585, 296.5, 296.8, 452, 468, 453, 296.3; 365/104, 226, 228, 189.11

[56] References Cited

U.S. PATENT DOCUMENTS

| 4,441,035 | 4/1984 | Demetriou | 307/475 X |
| 4,469,959 | 9/1984 | Luke et al. | 307/475 X |
| 4,482,824 | 11/1984 | Tzeng | 307/468 X |
| 4,716,307 | 12/1987 | Aoyama | 307/396.8 |
| 4,716,313 | 12/1987 | Hori et al. | 307/475 |
| 4,950,921 | 8/1990 | Takada | 307/296.1 |

Primary Examiner—Edward P. Westin
Assistant Examiner—David R. Bertleson
Attorney, Agent, or Firm—Sughrue, Mion, Zinn, Macpeak & Seas

[57] ABSTRACT

A step-down circuit is incorporated in a large scale integrated circuit for producing an internal power voltage from an external power voltage, and the step-down circuit comprises a reference signal generating unit for producing a reference signal indicative of a target level for the internal power voltage, first and second voltage regulating units for regulating the internal power voltage to the target level, and a monitoring unit monitoring the voltage level of the power voltage and producing an enable signal in the standby mode of operation when the external power voltage exceeds a predetermined level, wherein the first and second voltage regulating units are selectively enabled depending upon mode of the large scale integrated circuit, i.e. an active mode and a standby mode, as well as the level of the external power voltage so that power consumption of the large scale integrated circuit is improved.

8 Claims, 4 Drawing Sheets

STEP-DOWN UNIT INCORPORATED IN LARGE SCALE INTEGRATED CIRCUIT

FIELD OF THE INVENTION

This invention relates to a large scale integrated circuit and, more particularly, to a step-down circuit incorporated in the large scale integrated circuit.

DESCRIPTION OF THE RELATED ART

Semiconductor manufacturers have made efforts to miniaturize component transistors integrated on a single semiconductor chip, and large integrated circuits are fabricated from extremely small sized field effect transistors with a channel length of the order of 0.5 micron. The shorter the channel length is, the thinner the gate oxide film is. An extremely thin gate oxide film is much liable to be damaged with a power voltage level, and the large scale integration suffers from low reliability.

One of the approaches to improve the reliability is to provide a step-down unit for producing an internal power voltage lower than the external power voltage, and FIG. 1 shows a typical example of the step-down unit incorporated in a large scale integrated circuit.

The prior art step-down unit largely comprises a reference signal generating unit 1, and first and second voltage regulating units 2 and 3. An external power voltage Vext is supplied to the first and second voltage regulating units 2 and 3, and the external power voltage Vext ranges from 3 volts to 7 volts depending upon a large scale integrated circuit equipped with the prior art step-down unit. The reference signal generating unit 1 produces a reference signal REF, and the reference signal REF is constant in voltage level at all times as will be described in the next paragraph. The constant voltage level depends on the thickness of the thin gate oxide films of component field effect transistors and is adjusted to a critical level Vc hardly damaging the thin gate oxide films. The constant voltage level usually ranges between 3.3 volts and 4 volts. The power consumption of the reference signal generating unit 1 is negligible with respect to the first and second power regulating circuits 2 and 3.

FIG. 2 shows the reference signal REF in terms of the external power voltage Vext, and plots A stand for the reference signal REF. Broken lines indicate the linearly increasing external voltage level Vext. The voltage level of the reference signal REF is increased together with the external power voltage level Vext in so far as the external power voltage Vext is much lower than the critical level Vc. However, if the external power voltage Vext is growing close to the critical level Vc, the plots A is gradually separated from the broken lines. If the external power voltage level Vext exceeds the critical level Vc, the reference signal REF is saturated at the critical level Vc.

Turing back to FIG. 1, the first voltage regulating circuit 2 comprises a current mirror amplifier which has two series combinations of p-channel type field effect transistors Qp1 and Qp2, n-channel type field effect transistors Qn3 and Qn4 coupled in parallel between the source of external power voltage Vext and a common node N1, and an n-channel type field effect transistor Qn5 coupled between the common node N1 and a ground node. The reference signal REF is supplied to the gate electrode of the n-channel type field effect transistor Qn3, and an internal power supply line INT is coupled to the gate electrode of the n-channel type field effect transistor Qn4. The internal power supply line INT distributes an internal power voltage Vint to the component field effect transistors with the respective thin gate oxide films. The common drain node N2 of the field effect transistors Qp2 and Qn4 is coupled to the gate electrodes of the p-channel type field effect transistors Qp1 and Qp2, and the common drain node N3 of the field effect transistors Qp1 and Qn3 is coupled to the gate electrode of a p-channel type field effect transistor Qp6 coupled between the source of external power voltage Vext and the internal power supply line INT. All of the field effect transistors Qp1 to Qp6 of the first power voltage regulating unit 2 have gate oxide films thick enough to withstand the external power voltage Vext.

The first voltage regulating unit 2 thus arranged regulates the internal power voltage Vint. In detail, since the gate electrode of the n-channel type field effect transistor Qn5 is supplied with the external power voltage Vext, the n-channel type field effect transistor Qn5 allows current to pass therethrough at all times. Current from the source of external power voltage Vext evenly splits into two branch currents which pass through the p-channel type field effect transistors Qp1 and Qp2, respectively in so far as the internal power voltage Vint is balanced with the critical level Vc of the reference signal REF. The p-channel type field effect transistor Qp1 provides resistance against the branch current, and the voltage level at the common drain node N3 is lower than the external voltage level Vext by the threshold level Vth of the p-channel type field effect transistor Qp1.

If the consumption of the internal power voltage Vint is increased, the internal power voltage level Vint is decayed, and, accordingly, the n-channel type field effect transistor Qn4 decreases the channel conductance. This results in that the voltage level at the common drain node N2 rises, and both p-channel type field effect transistors Qp1 and Qp2 decrease the respective channel conductances. The p-channel type field effect transistors Qp1 and Qp2 restrict the branch currents, respectively, and the voltage level at the common drain node N3 is decayed. The voltage level at the common drain node N3 thus decayed is relayed to the gate electrode of the p-channel type field effect transistor Qp6 and allows the p-channel type field effect transistor Qp6 to supplement current to the internal power voltage line INT. The internal power voltage level Vint is, then, recovered to the previous level balanced with the voltage level Vc of the reference signal REF.

If the consumption of the internal power voltage Vint is decreased and, accordingly, the internal power voltage level Vint rises, the n-channel type field effect transistor Qn4 increases the channel conductance, and the voltage level at the common drain node N2 is decayed. The voltage level at the common drain node N2 thus decayed allows the p-channel type field effect transistors Qp1 and Qp2 to increase the channel conductances and, accordingly, the branch currents. This results in that the voltage level at the common drain node N3 rises, and the p-channel type field effect transistor Qp6 decreases the current to the internal power voltage line INT. Then, the internal power voltage level Vint is decayed to the previous level balanced with the voltage level Vc of the reference signal REF.

The second voltage regulating unit 3 is similar in circuit arrangement to the first voltage regulating unit 2 except for an n-channel type field effect transistor Qn12 and a p-channel type field effect transistor Qp13. References Qp7, Qp8, Qn9, Qn10, Qp11 designate component field effect transistors corresponding to the field effect transistors Qp1 to Qp6, respectively, and nodes N4 to N6 correspond to the nodes N1 to N3, respectively. All of the component field effect transistors Qp7 to Qp13 well withstand the external power voltage level Vext. The n-channel type field effect transistor Qn12 is coupled between the common node N4 and the ground node, and is supplied at the gate electrode thereof with a chip select signal CS. The p-channel type field effect transistor Qp13 is coupled between the source of external power voltage Vext and the common drain node N6, and is gated by the chip select signal CS.

If the chip select signal CS goes up to an active high voltage level as high as the external power voltage level Vext, the n-channel type field effect transistor Qn12 turns on, and the p-channel type field effect transistor Qp13 turns off. Then, the second voltage regulating unit 3 behaves as similar to the first voltage regulating unit 2. However, if the chip select signal CS remains in an inactive low voltage level, the n-channel type field effect transistor Qn12 turns off to deactivate the current mirror amplifier consisting of the field effect transistors Qp7 to Qn10. The chip select signal CS of the low voltage level allows the p-channel type field effect transistor Qp13 to turn on to supply the external power voltage level Vext to the gate electrode of the p-channel type field effect transistor Qp11. With the external power voltage level Vext, the p-channel type field effect transistor Qp11 is turned off, and the second voltage regulating unit 3 is surely deactivated with the chip select signal CS of the low voltage level.

Thus, only the first voltage regulating unit 2 participates the voltage regulation in the non-selected state or a standby mode, however, both of the first and second voltage regulating units 2 and 3 regulate the internal power voltage level Vint to the voltage level of the reference signal REF in the selected state or an active mode. The component transistors Qp1 to Qp6 of the first voltage regulating unit 2 is smaller in size than those of the second voltage regulating unit 3, and, for this reason, the power consumption in the non-selected state is relatively small. However, the internal power supply in the selected state is large enough to support the functions of the large scale integrated circuit.

A problem is encountered in that the power consumption in the standby mode is increased rather than a large scale integrated circuit without any internal step-down circuit. In detail, while the large scale integrated circuit shown in FIG. 1 is in the active mode, the power consumption of the large scale integrated circuit is estimated at the sum of the power consumptions of the first and second voltage regulating units 2 and 3 and the power consumption of the internal circuit coupled to the internal power voltage line INT. If a large scale integrated circuit does not equip with any step-down circuit, the power consumptions of the first and second voltage regulating units 2 and 3 are deleted from the total power consumption. However, the power consumptions of the first and second voltage regulating units 2 and 3 are much smaller than the power consumption of the internal circuit in the active mode, and the total power consumption of the large scale integrated circuit shown in FIG. 1 is substantially as large as that of a large scale integrated circuit without any step-down circuit.

On the other hand, if the large scale integrated circuit shown in FIG. 1 enters the standby mode, the total power consumption is estimated at the sum of the power consumption of the first voltage regulating unit 2 and the power consumption of the internal circuit. The internal circuit such as a memory cell array consumes current much smaller than that in the active mode, and the power consumption of the first voltage regulating unit 2 can not be ignored. If a large scale integrated circuit does not equip with the step-down circuit, the power consumption in the standby mode is as small as that of the internal circuit.

As described hereinbefore, the power consumption of the first voltage regulating unit 2 can not be ignored in the standby mode in view of the total power consumption, and, for this reason, the large scale integrated circuit equipped with the step-down circuit is suffers from large power consumption.

SUMMARY OF THE INVENTION

It is therefore an important object of the present invention to provide a step-down circuit which does not deteriorate the power consumption of an integrated circuit in a standby mode.

To accomplish these objects, the present invention proposes to disenable a first voltage regulating unit when an external power voltage is lowered to a predetermined level.

In accordance with the present invention, there is provided a step-down circuit incorporated in an integrated circuit for producing an internal power voltage from an external power voltage, the integrated circuit selectively entering an active mode and a standby mode of operation, comprising: a) a reference signal generating unit producing a reference signal indicative of a target level for the internal power voltage; b) first and second voltage regulating units for regulating the internal power voltage to the target level, the first and second voltage regulating units being enabled when the integrated circuit enters the active mode of operation, the second voltage regulating unit being disenabled in the standby mode of operation; and c) a monitoring unit monitoring the voltage level of the power voltage and producing an enable signal when the external power voltage exceeds a predetermined voltage level in the standby mode of operation, in which the first voltage regulating unit is enabled in the presence of the enable signal in the standby mode of operation.

BRIEF DESCRIPTION OF THE DRAWINGS

The features and advantages of the step-down circuit according to the present invention will be more clearly understood from the following description taken in conjunction with the accompanying drawings in which.

DESCRIPTION OF THE PREFERRED EMBODIMENTS

First Embodiment

Figure 1:
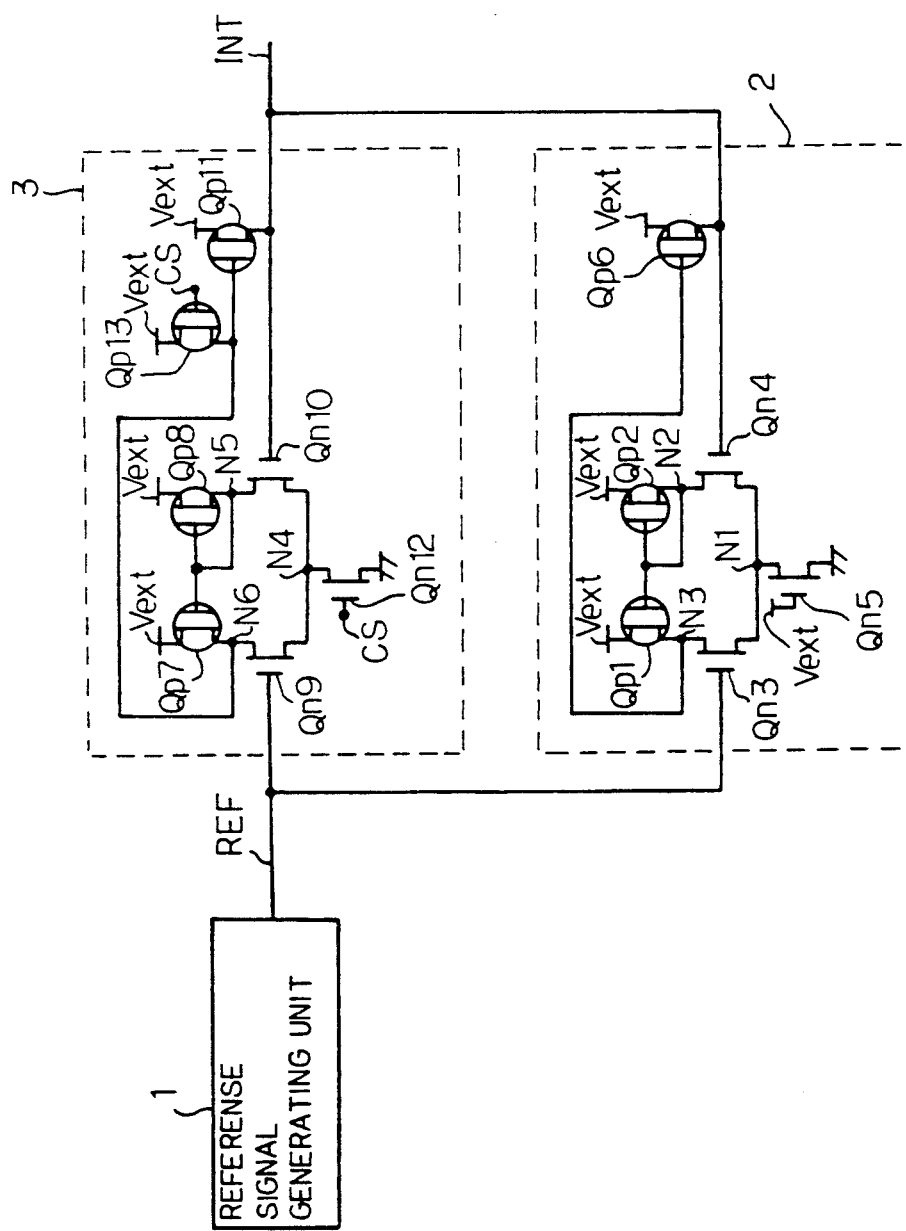
FIG. 1 is a circuit diagram showing the arrangement of the prior art step-down circuit.
Figure 2:
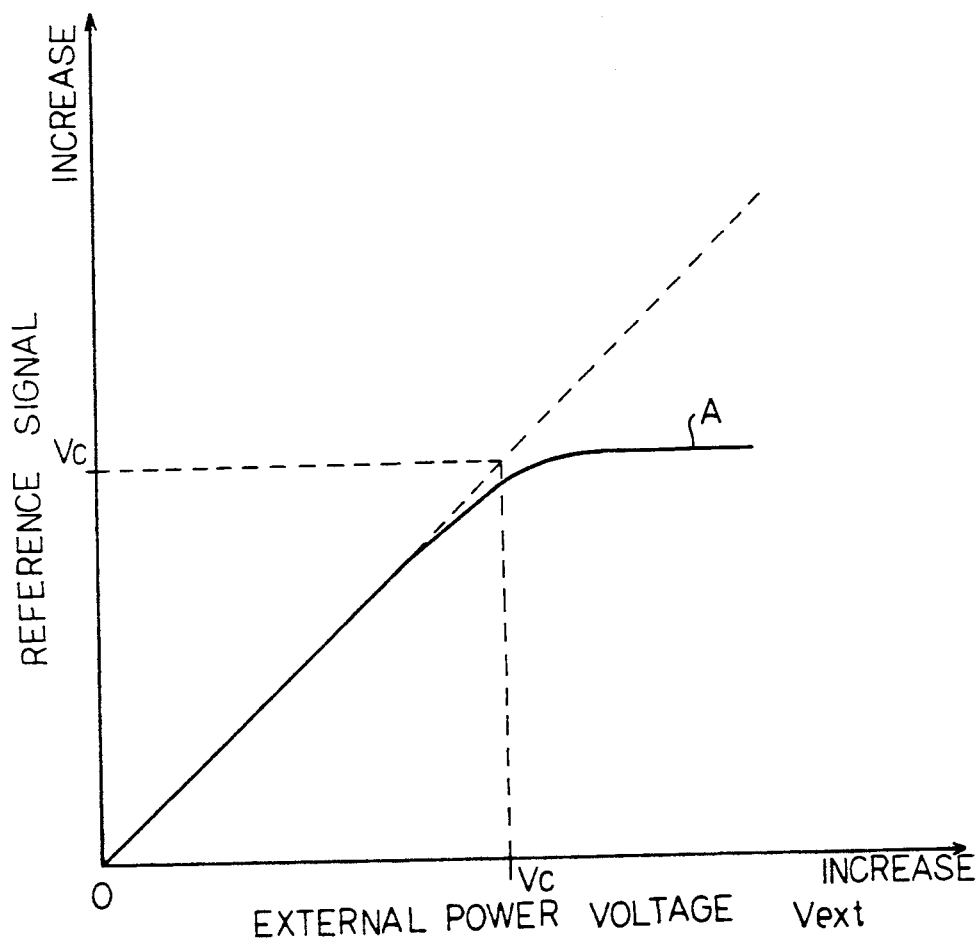
FIG. 2 is a graph showing the voltage level of a reference signal used in the prior art step-down circuit in terms of the voltage level of an external power voltage.
Figure 3:
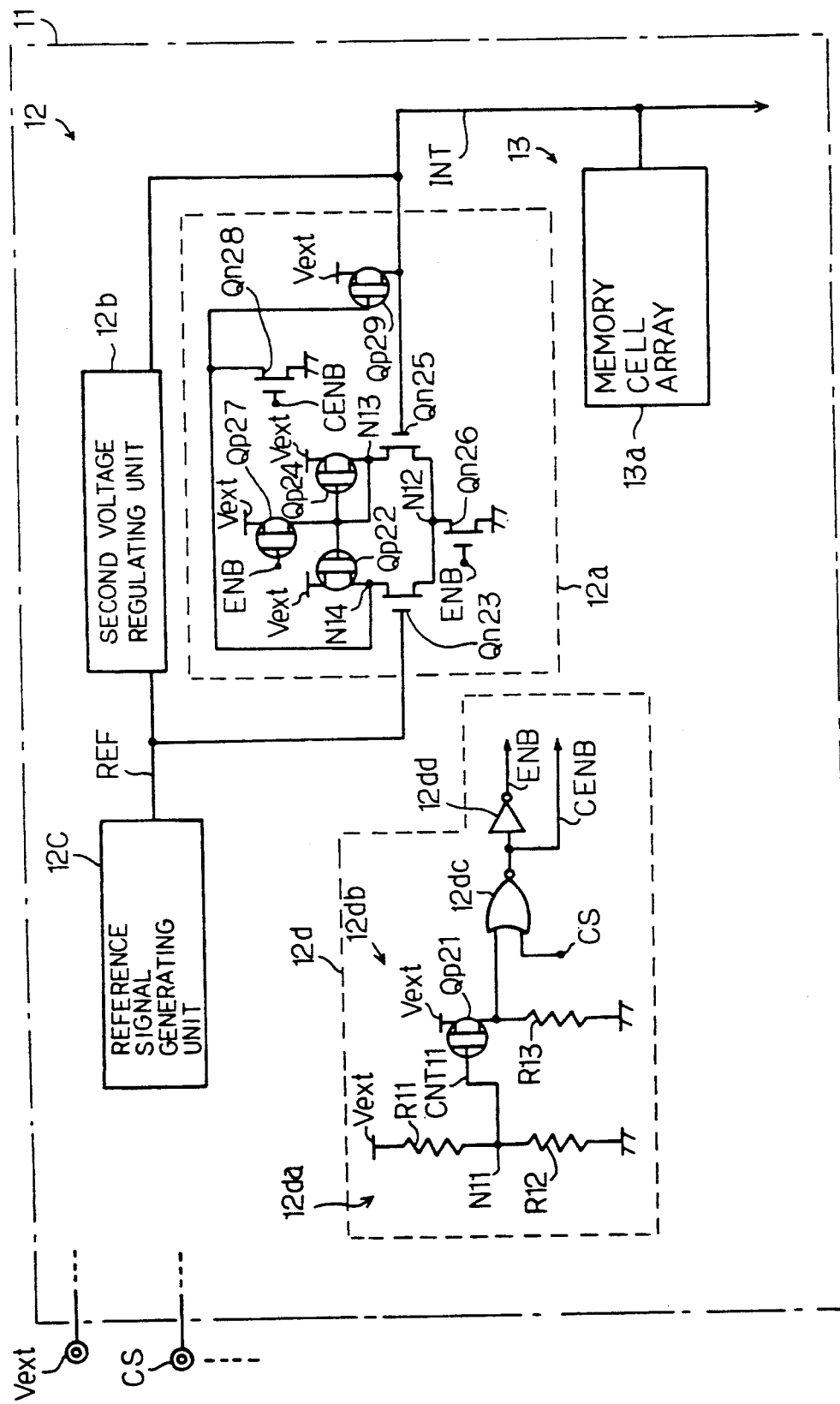
FIG. 3 is a circuit diagram showing the arrangement of a large scale integrated circuit equipped with a step-down circuit according to the present invention.

Referring to FIG. 3 of the drawings, a large scale integrated circuit equipped with a step-down circuit embodying the present invention is fabricated on a single semiconductor chip 11. The large scale integrated circuit is fabricated from a step-down circuit 12 and internal circuits including a memory cell array 13a. The large scale integrated circuit is supplied with an external power voltage Vext and various external control signals, and one of the external control signals is a chip select signal CS. Since only the chip select signal CS directly concerns the step-down circuit 12, other external control signals are not shown in the drawings. The step-down circuit 12 is supplied with the external power voltage Vext and produces an internal power voltage Vint which is distributed to the some of the internal circuits 13 through an internal power voltage line INT.

The step-down circuit 12 largely comprises first and second voltage regulating units 12a and 12b, a reference signal generating unit 12c, and a monitoring unit 12d. Since the external power voltage Vext is supplied to the first and second voltage regulating units 12a and 12b, the reference signal generating unit 12c and the monitoring unit 12d, the component elements of those units 12a to 12d have respective gate insulating films thick enough to withstand the external power voltage Vext. The second voltage regulating unit 12b and the reference signal generating unit 12c are similar in arrangement to the second voltage regulating unit 3 and the reference signal generating unit 1, and detailed description is omitted for the sake of simplicity.

The monitoring unit 12d comprises a voltage divider 12da coupled between a source of external power voltage Vext and a ground node, a voltage detector 12db coupled between the source of external power voltage Vext and the ground node, a NOR gate 12dc, and an inverting circuit 12dd. The voltage divider 12da is implemented by a series combination of resisters R11 and R12, and a control voltage CNT11 takes place at a node N11. The voltage detector 12db is implemented by a series combination of a p-channel type field effect transistor Qp21 and a resister R13, and is responsive to the control voltage CNT11 so that the p-channel type field effect transistor Qp21 turns on and off depending upon the control voltage CNT11. A monitoring signal takes place at the drain of the p-channel type field effect transistor Qp21.

Since the resisters R11 and R12 have extremely high resistances, current passing therethrough is negligible. In this instance, resisters R11 and R12 satisfy the following relationship $$r12/(r11+r12) = 3 - |Vtp|/3 \quad \text{Equation 1}$$

where r11 and r12 are resistances of the resisters R11 and R12, respectively, and Vtp is the threshold level of the p-channel type field effect transistor Qp21. The left side of Equation 1 indicates the control voltage CNT11 at the node N11. If the external power voltage Vext is not higher than 3 volts, the difference voltage between the source node and the gate electrode of the p-channel type field effect transistor Qp21 never exceeds the threshold level |Vtp|, and the p-channel type field effect transistor Qp21 remains off.

In detail, while the chip select signal CS is in the active high voltage level, the NOR gate 12dc produces a complementary enable signal CENB of a low level regardless of the control voltage CNT11 and, accordingly, the monitoring signal, and the inverting circuit 12dd produces the enable signal ENB of an active high level.

However, if the chip select signal CS goes down to the inactive low level, the NOR gate becomes responsive to the monitoring signal. While the control voltage CNT11 exceeds a predetermined level, the p-channel type field effect transistor Qp21 turns on, and the monitoring signal of the high level causes the NOR gate 12dc to produce the complementary enable signal ENB of the low level. Therefore, the enable signal ENB remains in the active high level.

On the other hand, if the external voltage level Vext is equal to or less than about 3 volts, the p-channel type field effect transistor Qp21 turns off, because the difference voltage between the source node and the gate electrode becomes smaller than the threshold level Vtp thereof. Then, the NOR gate 12dc shifts the output thereof to the inactive high level, and any enable signal does not take place at the output node of the inverting circuit.

Figure 4:
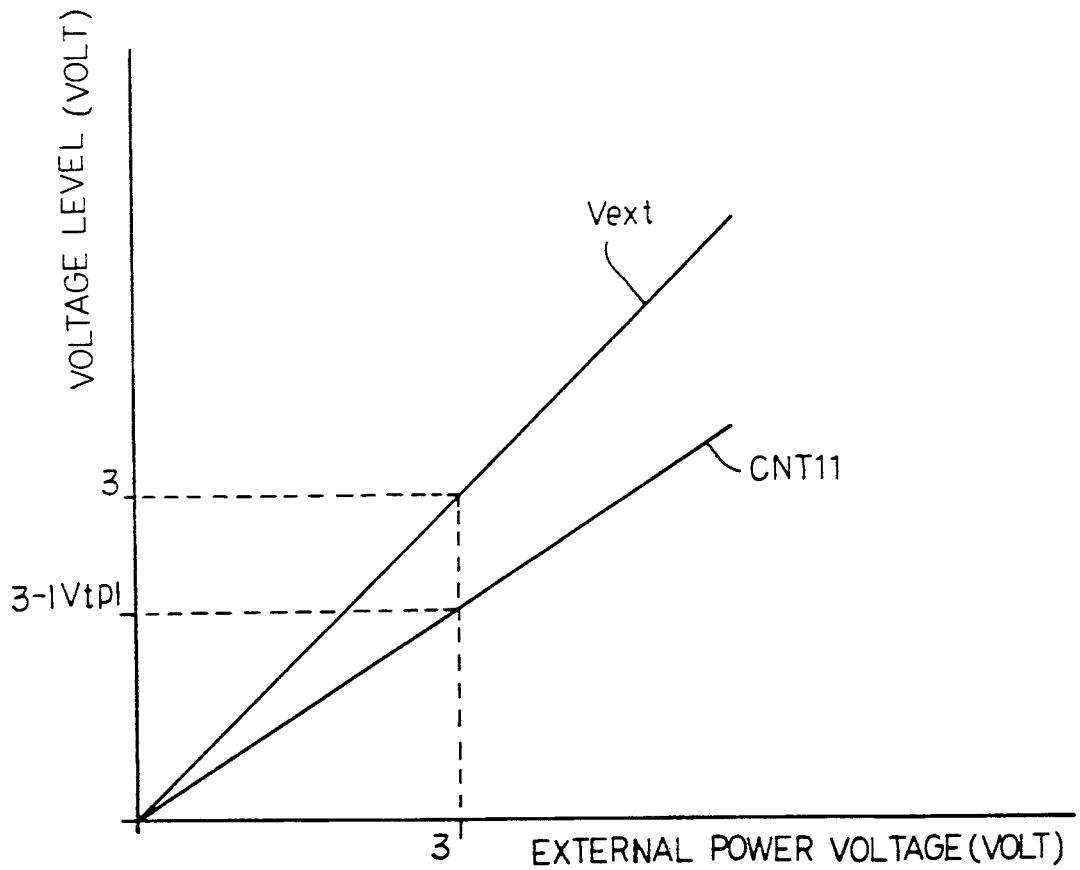
FIG. 4 is a graph showing the output characteristics of the controlling circuit shown in FIG. 3.

Thus, the voltage divider 12da cooperates with the voltage detector 12db and monitors the level of the external power voltage Vext. FIG. 4 shows the difference voltage between the source of external power voltage Vext and the node N11. The difference voltage is decreased together with the external power voltage level Vext, and the monitoring unit 12d produces the enable signal ENB when the external power voltage Vext exceeds about 3 volts.

The first voltage regulating unit 12a comprises a current mirror amplifier which has a series combination of a p-channel type first field effect transistor Qp22 and an n-channel type second field effect transistor Qn23 coupled between the source of external power voltage Vext and a common node N12, a series combination of a p-channel type third field effect transistor Qp24 and an n-channel type fourth field effect transistor Qn25 coupled between the source of external power voltage Vext and the common node N12, an n-channel type fifth field effect transistor Qn26 coupled between the common node N12 and the ground node, and a p-channel type sixth field effect transistor Qp27 coupled between the source of external power voltage Vext and gate electrodes of the p-channel type first and third field effect transistors Qp22 and Qp24. The reference signal REF is supplied to the gate electrode of the n-channel type second field effect transistor Qn23, and the gate electrode of the n-channel type fourth field effect transistor Qn25 is coupled to the internal power voltage line INT. The gate electrodes of the p-channel type first and third field effect transistors Qp22 and Qp24 are coupled to the common drain node N13 of the field effect transistors Qp24 and Qn25, and the enable signal ENB is supplied to the gate electrode of the n-channel type fifth field effect transistor Qn26 and to the gate electrode of the p-channel type sixth field effect transistor Qp27.

The first voltage regulating unit 12a further comprises an n-channel type seventh field effect transistor Qn28 coupled between a common drain node N14 and the ground node, and a p-channel type eighth field effect transistor Qp29 coupled between the source of external power voltage Vext and the internal power voltage line INT. The common drain node N14 is coupled to the gate electrode of the p-channel type eighth field effect transistor Qp29, and, accordingly, the eighty field effect transistor Qp29 varies the channel conductance thereof depending upon the voltage level at the common drain node N14. The complementary enable signal CENB is supplied to the gate electrode of the n-channel type seventh field effect transistor, and the n-channel type seventh field effect transistor Qn28 causes the p-channel type field effect transistor Qp29 forcibly to turn on.

Description is hereinbelow made on the circuit behavior. While the chip select signal CS remains in the active high level, the second voltage regulating unit 12b participates the regulation of the internal power voltage Vint as similar to the prior art step-down circuit. The enable signal of the high level is produced regardless of the external power voltage Vext in the presence of the chip select signal CS of the high level, and the first voltage regulating unit 12a also regulates the internal power voltage Vint. Namely, the enable signal ENB allows the n-channel type fifth field effect transistor Qn26 to turn on, and the p-channel type sixth field effect transistor Qp27 to turn off. The complementary enable signal CENB of the low level keeps the n-channel type seventh field effect transistor Qn28 off, and the p-channel type eighth field effect transistor Qp29 becomes responsive to the voltage level at the common drain node N14. In detail, current from the external power voltage source Vext evenly splits into two branch currents which pass through the p-channel type field effect transistors Qp1 and Qp2, respectively in so far as the internal power voltage Vint is balanced with the voltage level Vc of the reference signal REF. The p-channel type first field effect transistor Qp22 provides resistance against the branch current, and the voltage level at the common drain node N14 is lower than the external voltage level Vext by the threshold level Vth of the p-channel type field effect transistor Qp1.

If the consumption of the internal power voltage Vint is increased, the internal voltage level Vint is decayed, and, accordingly, the n-channel type fourth field effect transistor Qn25 decreases the channel conductance. This results in that the voltage level at the common drain node N13 rises, and both p-channel type first and third field effect transistors Qp22 and Qp24 decrease the respective channel conductances. The p-channel type first field effect transistors Qp22 and Qp24 restrict the branch currents, respectively, and the voltage level at the common drain node N14 is decayed. The voltage level at the common drain node N14 thus decayed is relayed to the gate electrode of the p-channel type eighth field effect transistor Qp29 and allows the p-channel type eighth field effect transistor Qp29 to supplement current to the internal power voltage line INT. The internal power voltage level Vint is, then, recovered to the previous level balanced with the voltage level Vc of the reference signal REF.

If the consumption of the internal power voltage Vint is decreased and, accordingly, the internal power voltage level Vint rises, the n-channel type fourth field effect transistor Qn25 increases the channel conductance, and the voltage level at the common drain node N13 is decayed. The voltage level at the common drain node N13 thus decayed allows the p-channel type first and third field effect transistors Qp22 and Qp24 to increase the channel conductances and, accordingly, the branch currents. This results in that the voltage level at the common drain node N14 rises, and the p-channel type eighth field effect transistor Qp29 decreases the current to the internal power voltage line INT. Then, the internal power voltage level Vint is decayed to the previous level balanced with the voltage level Vc of the reference signal REF. The total power consumption of the large scale integrated circuit is approximately equal to that of the prior art large scale integrated circuit.

If the chip select signal CS goes down to the inactive low level, the second voltage regulating unit 12b is deactivated. However, the first voltage regulating unit 12a still activated with the enable signal ENB of the high level in so far as the external power voltage Vext exceeds the predetermined level. The behavior of the first voltage regulating unit 12a is similar to that in the presence of the chip select signal of the high level. The total power consumption is approximately equal to that of the prior art.

If the external power voltage Vext reaches the predetermined level and is lowered, the output node of the inverting circuit 12dd is shifted to the inactive low level, and the n-channel type fifth field effect transistor Qn26 turns off. The output node in the inactive low level allows the p-channel type sixth field effect transistor Qp27 to turn on, and this results in that the p-channel type first and third field effect transistors Qp22 and Qp24 forcibly turn off. Thus, the current mirror amplifier is cut from the source of external power voltage Vext as well as the ground node. The NOR gate 12dc shifts the output node thereof to the inactive high level, and the n-channel type seventh field effect transistor Qn28 forcibly turns on. This results in that the p-channel type eighth field effect transistor Qp29 forcibly turns on to supply the external power voltage to the internal power voltage line INT. The source of external power voltage Vext supplies current through the p-channel type eighth field effect transistor Qp29 to the internal circuits such as the memory cell array 13a. The external power voltage Vext hardly damages the component transistors of the internal circuits, because the external power voltage Vext is not applied to the component transistors at all times.

Thus, no current flows through the current mirror amplifier, and only the internal circuits 13 consumes electric current. The total power consumption is surely decreased.

Second Embodiment

Figure 5:
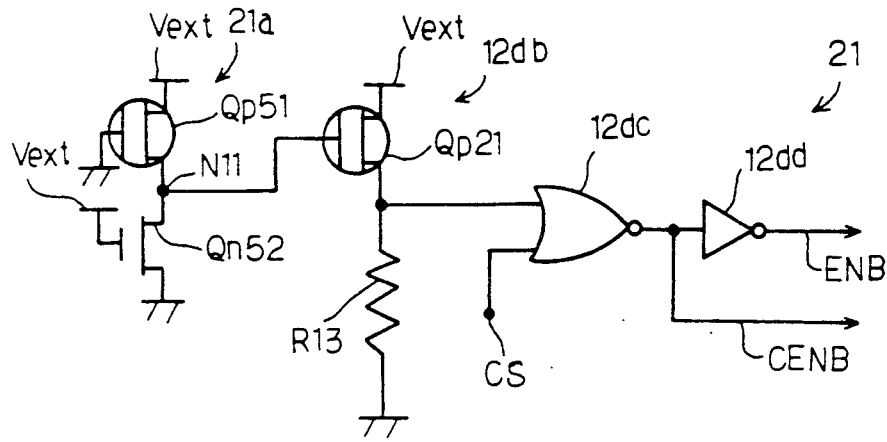
FIG. 5 is a circuit diagram showing the arrangement of a monitoring unit incorporated in another step-down circuit according to the present invention.

Turning to FIG. 5 of the drawings, a monitoring unit 21 incorporated in other step-down circuit is illustrated. The other component units 12a, 12b and 12c are also incorporated in the other step-down circuit. The monitoring unit 21 is similar to the monitoring unit 12d except for the voltage divider 21a, and description is focused upon the voltage divider 21a only.

The voltage divider 21a is implemented by a series combination of a p-channel type field effect transistor Qp51 and an n-channel type field effect transistor Qn52 coupled between the source of external power voltage Vext and the ground node. The gate electrode of the p-channel type field effect transistor Qp51 is coupled to the ground node, and the source of external power voltage Vext supplies the external voltage vext to the gate electrode of the n-channel type field effect transistor Qn52. The p-channel type field effect transistor Qp51 and the n-channel type field effect transistor Qn52 thus coupled produce resistance r11 and r12, and are designed to satisfy Equation 1. The circuit behavior of the second embodiment is similar to that of the first embodiment, and no further description is incorporated hereinbelow.

Although particular embodiments of the present invention have been shown and described, it will be obvious to those skilled in the art that various changes and modifications may be made without departing from the spirit and scope of the present invention.

What is claimed is:

1. A step-down circuit incorporated in an integrated circuit for producing an internal power voltage from an external power voltage, said integrated circuit selectively entering an active mode and a standby mode of operation, comprising:
   a) a reference signal generating unit producing a reference signal indicative of a target level for said internal power voltage;
   b) first and second voltage regulating units for regulating said internal power voltage to said target level, said first and second voltage regulating units being enabled when said integrated circuit enters said active mode of operation, said second voltage regulating unit being disenabled in said standby mode of operation; and
   c) a monitoring unit monitoring the voltage level of said power voltage and producing an enable signal when said external power voltage exceeds a predetermined voltage level in said standby mode of operation, in which said first voltage regulating unit is enabled in the presence of said enable signal in said standby mode of operation.

2. A step-down circuit as set forth in claim 1, in which said first voltage regulating unit comprises a series combination of a first transistor of a first channel conductivity type, a first common drain node and a second transistor of a second channel conductivity type coupled between a source of said external power voltage and a common node, a series combination of a third transistor of said first channel conductivity type, a second common drain node and a fourth transistor of said second channel conductivity type coupled between said source of said external power voltage and said common node, a fifth transistor of said second channel conductivity type coupled between said common node and a ground node, a sixth transistor of said first channel conductivity type coupled between said source of said external power voltage and the gate electrodes of said first and third transistors, a seventh transistor of said second channel conductivity type coupled between said first common drain node and said ground node, and an eighth transistor of said first channel conductivity type coupled between said source of said external power voltage and a source of internal power voltage, said second common drain node being coupled to the gate electrodes of said first and third transistors, said reference signal and said internal power voltage being supplied to the gate electrodes of said second and fourth transistors, respectively, said enable signal being supplied to the gate electrodes of said fifth and sixth transistors, a complementary signal of said enable signal being supplied to the gate electrode of said seventh transistor, said first common drain node being coupled to the gate electrode of said eighth transistor.

3. A step-down circuit as set forth in claim 2, in which said monitoring unit comprises a voltage divider coupled between said source of said external power voltage and said ground node for producing a control voltage, a voltage detector coupled between said source of said external power voltage and said ground node and responsive to said control voltage for producing a monitoring signal, a logic gate enabled with an external control signal indicative of said active mode and responsive to said monitoring signal for producing said complementary signal, and an inverting circuit coupled to the output node of said logic gate and producing said enable signal.

4. A step-down circuit as set forth in claim 3, in which said voltage divider is implemented by a series combination of first and second resisters.

5. A step-down circuit as set forth in claim 3, in which said voltage detector comprises a series combination of a ninth transistor of said first channel conductivity type and a third resister, and in which said control voltage is supplied to said ninth transistor.

6. A step-down circuit as set forth in claim 3, in which said logic gate carries out a NOR operation.

7. A step-down circuit as set forth in claim 6, in which said external control signal is a chip select signal.

8. A step-down circuit as set forth in claim 3, in which said voltage divider comprises a series combination of a tenth transistor of said first channel conductivity type and an eleventh transistor of said second channel conductivity type, the gate electrodes of said tenth and eleventh transistors being coupled to said ground node and said source of said external power voltage, respectively.

* * * * *